US008550792B2

(12) United States Patent
Solovyeva et al.

(10) Patent No.: US 8,550,792 B2
(45) Date of Patent: *Oct. 8, 2013

(54) ENERGY CONVERSION DEVICE AND METHOD OF REDUCING FRICTION THEREIN

(75) Inventors: Lyudmila Mikhaylovna Solovyeva, Ann Arbor, MI (US); Kyle S. Jansson, St. Louis Park, MN (US); Alaa AbdelAzim Elmoursi, Troy, MI (US); Dong Zhu, Farmington Hills, MI (US); Robert Milner, Warren, MI (US); Earl Eugene Daugherty, Greenwood, SC (US); Clifton Baxter Higdon, Birmingham, MI (US); Kamel Abdel-Khalik Elagamy, Livonia, MI (US); Aaron Michael Hicks, Eden Prairie, MN (US)

(73) Assignee: Eaton Corporation, Cleveland, OH (US)

( * ) Notice: Subject to any disclaimer, the term of this patent is extended or adjusted under 35 U.S.C. 154(b) by 1119 days.

This patent is subject to a terminal disclaimer.

(21) Appl. No.: 12/493,885

(22) Filed: Jun. 29, 2009

(65) Prior Publication Data

US 2009/0325828 A1    Dec. 31, 2009

Related U.S. Application Data

(60) Provisional application No. 61/133,491, filed on Jun. 30, 2008, provisional application No. 61/133,525, filed on Jun. 30, 2008, provisional application No. 61/133,541, filed on Jun. 30, 2008.

(51) Int. Cl.
*F04B 49/00* (2006.01)
(52) U.S. Cl.
USPC ............ 417/310; 418/152; 428/697; 428/698

(58) Field of Classification Search
USPC .............. 417/53, 415, 410.4, 410.5; 428/220, 428/658, 697, 698; 418/152–155, 179
See application file for complete search history.

(56) References Cited

U.S. PATENT DOCUMENTS

| 4,508,011 | A |   | 4/1985  | Nolden |         |
|-----------|---|---|---------|--------|---------|
| 5,458,927 | A | * | 10/1995 | Malaczynski et al. | 427/527 |

(Continued)

FOREIGN PATENT DOCUMENTS

| EP | 1657323 A1 | 5/2006 |
|----|------------|--------|
| EP | 1884978 A1 | 2/2008 |

(Continued)

OTHER PUBLICATIONS

Mohamed El Ashmawy and Hubertus Murrenhoff, "Experimental Investigation of Friction Force Between Vane Tip and Cam-Ring in Oil Vane Pumps", International Journal of Fluid Power, Mar. 2009, pp. 37-46, vol. 10, No. 1.

(Continued)

*Primary Examiner* — Devon Kramer
*Assistant Examiner* — Amene Bayou
(74) *Attorney, Agent, or Firm* — Quinn Law Group, PLLC (57) ABSTRACT

A device configured for converting energy includes a first surface, a second surface configured for moving with respect to the first surface during operation of the device, and a coating disposed on at least one of the first surface and the second surface. The coating includes a first layer of a ceramic alloy represented by the general formula $AlMgB_{14}$—X, wherein X is present in an amount of from 0 to 70 parts by weight based on 100 parts by weight of the ceramic alloy and is a doping agent selected from the group of Group IV elements and borides and nitrides thereof, and a second layer disposed on the first layer and including carbon in a gradient concentration. The coating has a hardness of from 10 to 20 GPa and a coefficient of friction of less than or equal to 0.12.

20 Claims, 5 Drawing Sheets

(56) References Cited

U.S. PATENT DOCUMENTS

| | | | |
|---|---|---|---|
| 5,520,088 | A | 5/1996 | Dixen |
| 5,581,881 | A | 12/1996 | Sherman et al. |
| 5,685,215 | A | 11/1997 | Jepsen et al. |
| 5,704,272 | A | 1/1998 | Durako, Jr. et al. |
| 5,728,475 | A | 3/1998 | Rateick, Jr. |
| 5,809,863 | A | 9/1998 | Tominaga et al. |
| 6,099,605 | A * | 8/2000 | Cook et al. .................. 51/307 |
| 6,217,289 | B1 | 4/2001 | Smith |
| 6,228,471 | B1 | 5/2001 | Neerinck et al. |
| 6,432,855 | B1 | 8/2002 | Cook et al. |
| 6,607,782 | B1 | 8/2003 | Malshe et al. |
| 6,837,342 | B1 | 1/2005 | Olschewski et al. |
| 6,895,855 | B2 | 5/2005 | Doll |
| 6,921,422 | B2 | 7/2005 | Cook et al. |
| 7,121,188 | B2 | 10/2006 | Thoms et al. |
| 7,172,641 | B2 | 2/2007 | Cook et al. |
| 7,188,562 | B2 | 3/2007 | Hansen et al. |
| 7,238,429 | B2 * | 7/2007 | Cook et al. .................. 428/650 |
| 7,263,925 | B1 | 9/2007 | Hansen et al. |
| 7,375,343 | B1 | 5/2008 | Cook et al. |
| 7,517,375 | B2 | 4/2009 | Cook et al. |
| 8,039,096 | B2 * | 10/2011 | Zhu et al. .................. 428/220 |
| 2003/0219605 | A1 * | 11/2003 | Molian et al. .................. 428/422 |
| 2005/0051975 | A1 | 3/2005 | Takayama et al. |
| 2005/0100748 | A1 * | 5/2005 | Cook et al. .................. 428/457 |
| 2005/0123686 | A1 | 6/2005 | Myrick |
| 2005/0275143 | A1 | 12/2005 | Toth |
| 2006/0134424 | A1 | 6/2006 | Plissonnier |
| 2008/0226897 | A1 | 9/2008 | Can et al. |

FOREIGN PATENT DOCUMENTS

| | | |
|---|---|---|
| WO | 03/068503 A1 | 8/2003 |
| WO | 2006125683 A1 | 11/2006 |

OTHER PUBLICATIONS

I. G. Goryachev, "Contact Mechanics in Tribology",1998, pp. 191-197, Kluewer, Codrecht.

H. C. Meng and K. C. Ludema, "Wear models and predictive equations: their form and content", Journal: Wear, 1995, pp. 443-457, vols. 181-183.

B. A. Cook, J. L. Harringa, T. L. Lewis, A. M. Russell, "A new class of ultra-hard material based on AlMgB14", Scripta Materilia, 2000, pp. 597-602, vol. 42.

A. Ahmed, S. Bahadur, B. A. Cook, J. Peters, "Mechanical properties and scratch test studies of new ultra-hard AlMgB14 modified by TiB2", Tribology International, 2006, pp. 129-137, vol. 39.

Y. Tian, A. F. Bastawros, C. C. H. Lo, A. P. Constant, A. M. Russell, B. A. Cook, "Superhard self-lubricating AlMgB14 films for microelectromechanical devices", Applied Physics Letters, 2003, pp. 2781-2783, vol. 83, No. 14.

J. A. Heimberg, K. J. Wahl, I. L. Singer, A. Erdemir, "Superlow friction behavior of diamond-like carbon coatings: Time and speed effects", Applied Physics Letters, 2001, pp. 2449-2451, vol. 78, No. 17.

D. G. Teer, "New solid lubricant coatings", Journal: Wear, 2001, pp. 1068-1074, vol. 251, Issues 1-12.

"Diamond-Like Protective Coatings for Metals and Other Substrates" http://www.diamonex/com/products_dlc.htm.

Yves Gachon, Christophe Heau, "Study of Mechanical Behavior of Diamond-Like Carbon Coatings by Several Instrumented Tribometers", Thin Solid Films, 2000, pp. 360-365, vol. 377-378.

European Materials Research Society 2005 Spring Meeting Grenoble, France, Symposium K, "Protective Coatings and Thin Films—05", May 31-Jun. 2, 2005.

Dr. X. Zhou, "Bearings Roll with Solid Lube Coatings", www.plantservices.com, Aug. 2006, Putman Media Inc.

Y. L. Su, W. H. Kao, "Tribological Behaviour and Wear Mechanism of MoS2-Cr Coatings Sliding Against Various Counterbody", Tribology International, 2003, pp. 11-23, vol. 36.

P. Hivart, B. Hauw, L. Dubar, J. P. Bricout, "Numerical Identification of Bulk Behavior Law of Manganese Phosphate Coatings. Comparison with Tribological Properties", Journal of Coatings Technology, Jul. 2003, pp. 37-44, vol. 75, No. 942.

G. Bolelli, L. Lusvarghi, F. Pighetti Mantini, F. Pitacco, H. Volz, "Enhanced Tribological Properties of PECVD DLC Coated Thermally Sprayed Coatings", Surface and Coatings Technology, 2008, pp. 4382-4386, vol. 202.

HEF Groupe Presentation, Southfield,MI, Apr. 21, 2005.

Office Action for U.S. Appl. No. 12/493,713, mailed on Mar. 17, 2011.

* cited by examiner

ENERGY CONVERSION DEVICE AND METHOD OF REDUCING FRICTION THEREIN

CROSS-REFERENCE TO RELATED APPLICATIONS

This application claims the benefit of U.S. Provisional Application 61/133,491, filed on Jun. 30, 2008; U.S. Provisional Application 61/133,525, filed on Jun. 30, 2008; and U.S. Provisional Application 61/133,541, filed on Jun. 30, 2008, which are hereby incorporated by reference in their entirety.

STATEMENT REGARDING FEDERALLY SPONSORED RESEARCH OR DEVELOPMENT

The invention described herein was made in the course of research under Department of Energy Grant No. DE-FG36-06GO16054. The federal government may have certain rights in the invention.

TECHNICAL FIELD

The invention relates to reducing friction between surfaces of a device.

BACKGROUND OF THE INVENTION

Devices with movable components may experience degradation, efficiency losses, and shortened service life due to component wear. For example, engine components, cutting tools, and devices configured for converting energy, such as hydraulic pumps and hydraulic motors, often include gears, bearings, and other movable components which translate and/or rotate with respect to a countersurface. After many operation cycles, friction between such movable components and the countersurface may cause degradation, i.e., wear, of the movable component. Such friction and wear may contribute to one or more performance problems of the devices.

For example, during a break-in period of hydraulic devices such as vane pumps, axial piston pumps, and orbital motors, increased friction between movable components often limits operating pressures, and in turn negatively impacts power density of the devices. To compensate for such pressure limitations, existing devices often require sulfur and/or phosphorus hydraulic fluid additives to generate protective sulfites and/or phosphates on surfaces of the devices.

Moreover, increased friction and wear often increases start-up torque requirements for devices. In particular, increased friction and wear may further decrease an already-low start-up mechanical efficiency of a device. For example, existing devices may exhibit low start-up mechanical efficiency and are often oversized above a nominal torque output to meet expected performance requirements. Increased friction further aggravates such low start-up efficiency and often requires a comparatively larger device, with accompanying larger energy consumption, to produce a given torque output.

Additionally, increased friction, and the accompanying wear and degradation at various mechanical interfaces, also decreases the mechanical efficiency of existing devices during non-start-up operating conditions. For example, increased friction may contribute to ring burn, i.e., excessive wear and gouging of a ring of a vane pump, which negatively impacts the mechanical efficiency and service life of existing vane pumps.

Further, increased friction may impose maximum operating speed and pressure limitations on existing devices operated with non-petroleum-based hydraulic fluids. Since non-petroleum-based hydraulic fluids typically provide decreased lubrication as compared to petroleum-based hydraulic fluids, any increased friction between components limits the operating speed and pressure of existing devices operated with non-petroleum-based hydraulic fluids.

SUMMARY OF THE INVENTION

A device configured for converting energy includes a first surface and a second surface. The second surface is configured for moving with respect to the first surface during operation of the device. The device also includes a coating disposed on at least one of the first surface and the second surface. The coating includes a first layer of a ceramic alloy represented by the general formula $AlMgB_{14}$—X, wherein X is present in an amount of from 0 to 70 parts by weight based on 100 parts by weight of the ceramic alloy and is a doping agent selected from the group of Group IV elements and borides and nitrides thereof. The coating also includes a second layer disposed on the first layer. The second layer includes carbon present in a gradient concentration. The coating has a hardness of from 10 to 20 GPa and a coefficient of friction of less than or equal to 0.12.

A method of reducing friction between the first surface and the second surface includes forming the first layer on at least one of the first surface and the second surface. The method also includes depositing the second layer onto the first layer to thereby form the coating on at least one of the first surface and the second surface that reduces friction between the first surface and the second surface.

The device exhibits reduced friction between surfaces and reduced wear during operation as compared to existing devices. Therefore, as compared to existing devices, the device requires less torque at start-up, has excellent start-up mechanical efficiency, operates over a larger range of pressure, and has excellent power density. Further, the device requires minimal hydraulic fuel additives, is smaller, and consumes less energy for a given torque output as compared to existing devices. Additionally, for applications requiring non-petroleum-based hydraulic fluid, the device operates over a larger range of speed and pressure as compared to existing devices. Finally, the device minimizes component degradation, such as ring burn.

The above features and advantages and other features and advantages of the present invention are readily apparent from the following detailed description of the best modes for carrying out the invention when taken in connection with the accompanying drawings.

DETAILED DESCRIPTION OF THE EMBODIMENTS

Figure 1:
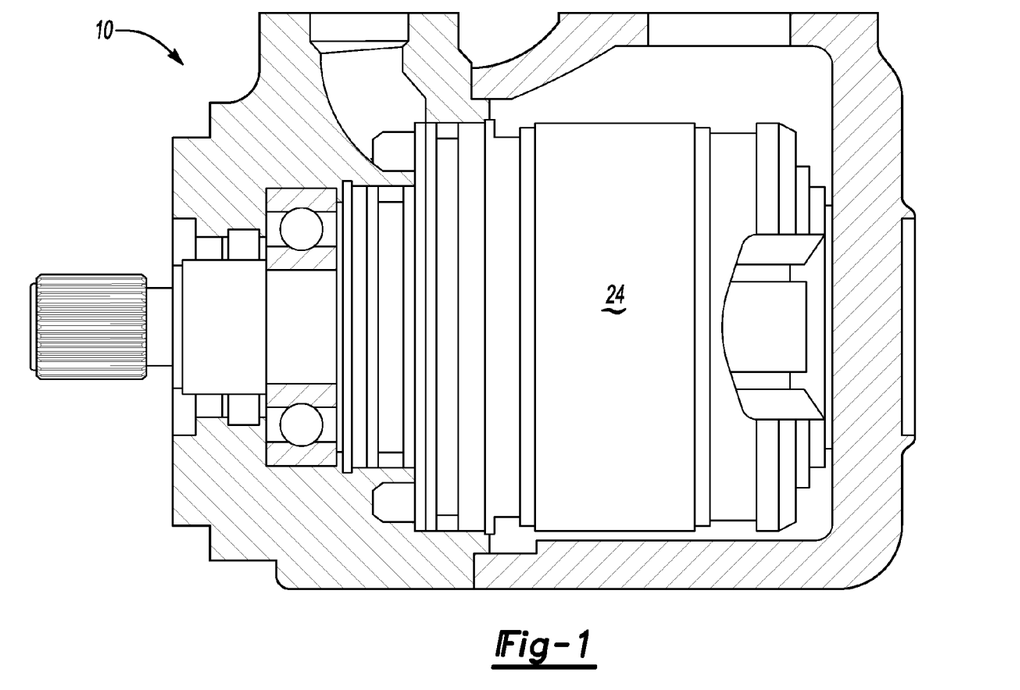
FIG. 1 is a schematic cross-sectional view of a vane pump.
Figure 3:
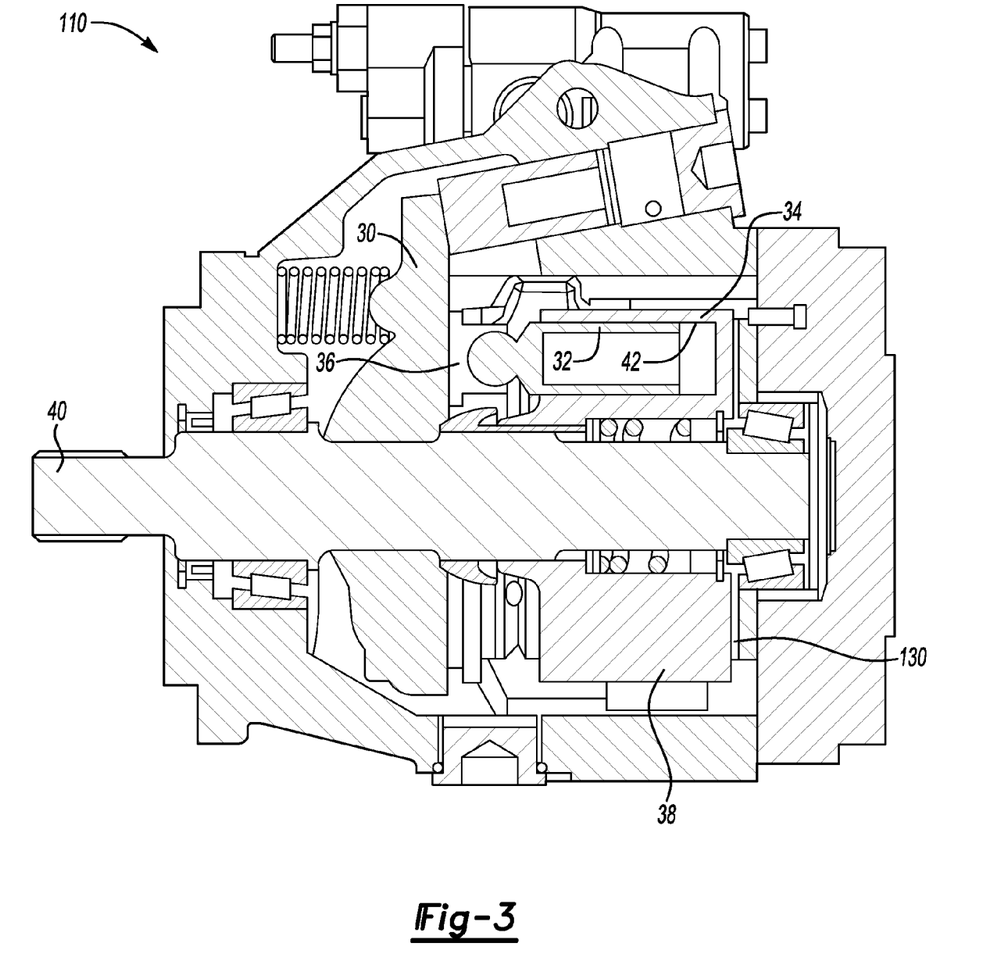
FIG. 3 is a schematic cross-sectional view of an axial piston pump.
Figure 4:
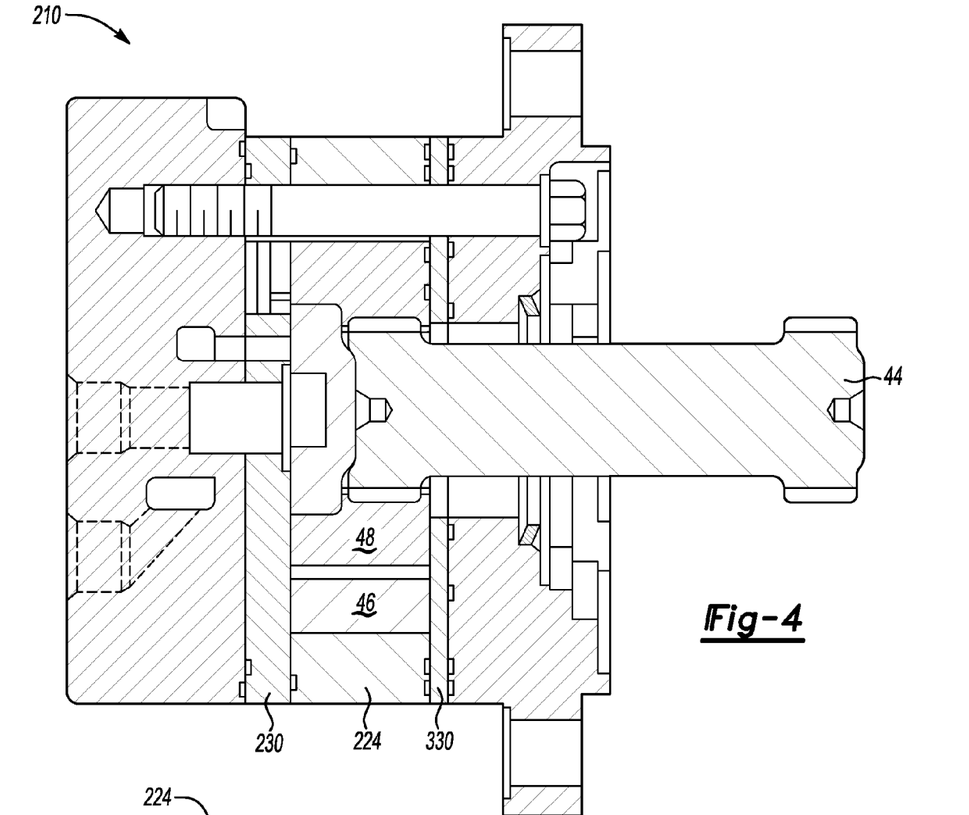
FIG. 4 is a schematic cross-sectional view of an orbital motor.

Referring to the drawings, wherein like reference numerals refer to like components, a device configured for converting energy is shown generally at 10, 110, and 210 in FIGS. 1, 3, and 4, respectively. The device 10, 110, 210 of the present invention is typically useful for applications requiring hydraulic pumps and motors, such as, but not limited to, agricultural augers and harvesters, construction equipment, and marine thrusters. However, it is to be appreciated that the device 10, 110, 210 of the present invention may be useful for any application requiring reduced friction between surfaces, such as vehicle wash systems, injection molding conveyors, and presses.

Figure 2:
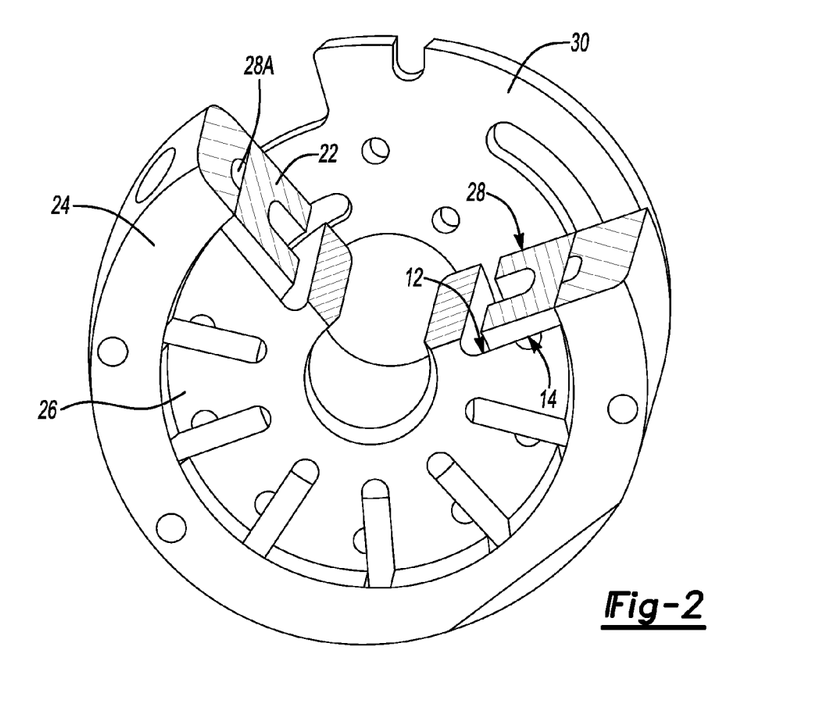
FIG. 2 is a schematic partially cut-away perspective view of a ring and a vane of the vane pump of FIG. 1.

Referring to FIGS. 1 and 2 and described with respect to device 10, the device 10 includes a first surface 12 and a second surface 14 configured for moving with respect to the first surface 12 during operation of the device 10. That is, the second surface 14 may, for example, slide and/or rotate with respect to the first surface 12. As such, the first surface 12 and the second surface 14 may be in close proximity in the device 10. For example, the first surface 12 and the second surface 14 may be separated by only a few millimeters or may be separated by a layer of fluid such as a lubricant. Alternatively, the second surface 14 may contact the first surface 12 during operation, as set forth in more detail below.

The first surface 12 and/or the second surface 14 may be formed of any suitable material. For example, the first surface 12 and/or the second surface 14 may be formed from metal. The first surface 12 and/or the second surface 14 may be formed from any suitable metal such as, but not limited to, M2 tool steel, A2 tool steel, 52100 steel, 8620 steel, and aluminum. Further, the first surface 12 and/or the second surface 14 may be, for example, a surface of an engine or a surface of a device configured for converting energy.

The device 10, 110, 210 also includes a coating 16 disposed on at least one of the first surface 12 and the second surface 14. For example, the coating 16 is shown disposed on the first surface 12 in FIG. 5.

Figure 5:
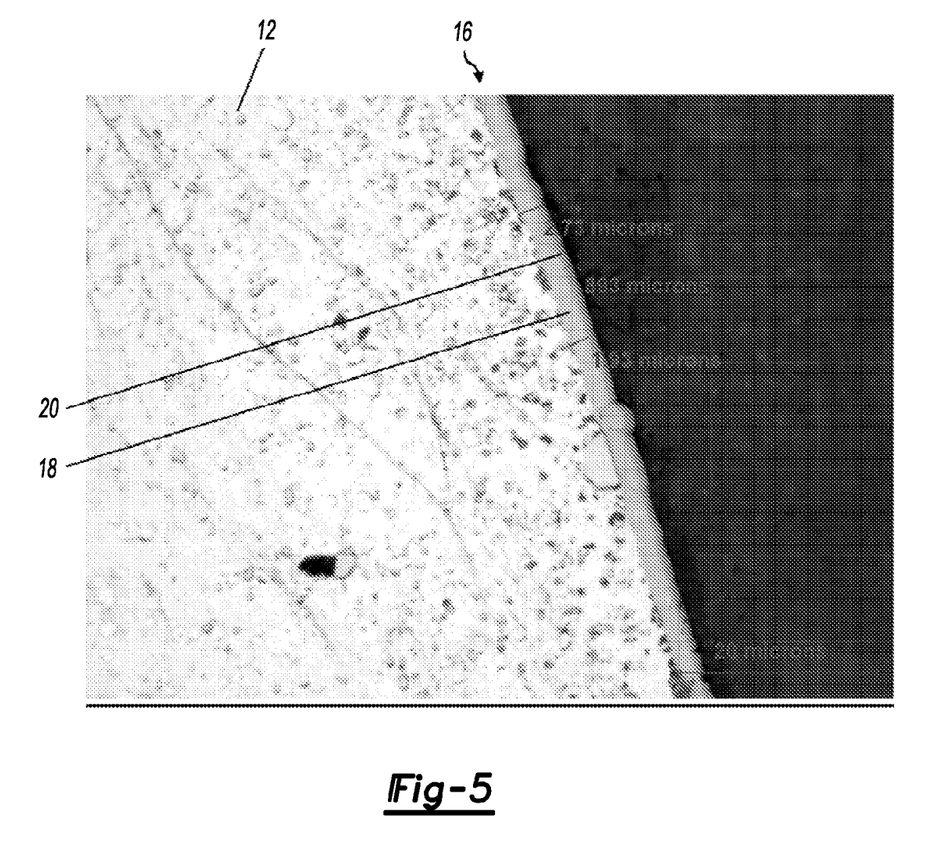
FIG. 5 is a reproduction of a scanning electron microscope photomicrograph of a coating disposed on a surface of the devices of FIGS. 1, 3, and 4.

Referring to FIG. 5, the coating 16 includes a first layer 18 of a ceramic alloy. The first layer 18 generally provides the coating 16 with excellent hardness and wear-resistance. The ceramic alloy is represented by the general formula $AlMgB_{14}$—X, wherein X is present in an amount of from 0 to 70 parts by weight based on 100 parts by weight of the ceramic alloy and is a doping agent selected from the group of Group IV elements and borides and nitrides thereof. That is, the ceramic alloy may be doped with elements such as, but not limited to, titanium and zirconium, and borides and nitrides thereof. The doping agent may be selected to increase the hardness of the ceramic alloy. A suitable specific example of X is $TiB_2$.

Therefore, in one example wherein X is not present in the ceramic alloy, i.e., X is present in an amount of 0 parts by weight, the ceramic alloy may be $Al_{0.75}Mg_{0.78}B_{14}$, commonly referred to as $AlMgB_{14}$. The ceramic alloy may also be a mixture of $AlMgB_{14}$ and one or more other aluminum magnesium boride compounds. In another example wherein X is present in the ceramic alloy in an amount greater than 0 parts by weight, the ceramic alloy may be $AlMgB_{14}$—$TiB_2$. That is, the ceramic alloy may be single phase, e.g., $AlMgB_{14}$, or multi-phase, e.g., $AlMgB_{14}$—$TiB_2$.

The ceramic alloy may be further described as a nanocomposite. As used herein, the terminology nanocomposite is used to represent a solid composite material having a phase dimension of less than 100 nm. Suitable examples of a ceramic alloy are commercially available under the trade name CTNC 3003 or CTNC 3004 from New Tech Ceramics of Des Moines, Iowa.

The first layer 18 may have a hardness of from 30 to 40 GPa. Further, the first layer 18 may have a thickness of from 0.5 to 4 microns. For example, the first layer 18 may have a thickness of from 1 to 3 microns.

Referring again to FIG. 5, the coating 16 also includes a second layer 20 disposed on the first layer 18. The second layer 20 generally provides the coating 16 with excellent lubricity. That is, the second layer 20 may function as a solid lubricant and provide the coating 16 with an excellent coefficient of friction, as set forth in more detail below.

The second layer 20 includes carbon present in a gradient concentration. In particular, the second layer 20 may include amorphous carbon, i.e., an allotrope of carbon that does not have a crystalline structure. The gradient concentration may increase with a distance from the first layer 18. That is, the gradient concentration of carbon may be selected depending on the lubricity, coefficient of friction, and wear-resistance requirements of the coating 16. The second layer 20 may be deposited onto the first layer 18, as set forth in more detail below, so that a concentration of carbon in the second layer 20 increases over a range of from about 1 part by weight to 90 parts by weight based on 100 parts by weight of the second layer 20. For example, at or near an interface between the first layer 18 and the second layer 20 of the coating 16, the concentration of carbon may be about 30 parts by weight based on 100 parts by weight of the second layer 20. And, as the distance from the first layer 18 increases, the concentration of carbon may gradually increase to about 50 parts by weight. Finally, at a distal edge of the second layer 20, the concentration of carbon may reach, for example, 90 parts by weight based on 100 parts by weight of the second layer 20.

In another example, the concentration of carbon may increase sharply from the interface of the first layer 18 and the second layer 20 to the distal edge of the second layer 20. Alternatively, the concentration of carbon may increase only slightly from the interface to the distal edge. It is to be appreciated that the concentration of carbon may also be substantially the same throughout the second layer 20.

For applications where the gradient concentration of carbon in the second layer 20 is less than 100 parts by weight, it is to be appreciated that the ceramic alloy of the first layer 18 is the other component present in the second layer 20. That is, the second layer 20 may be disposed on the first layer 18 so as to gradually transition between the ceramic alloy of the first layer 18 and the carbon of the second layer 20.

Without intending to be limited by theory, the second layer 20 may fill any valleys, pockets, and/or voids of the first layer 18 to smooth the peaks and provide excellent lubricity to the coating 16. That is, the first layer 18 of the coating 16 may include microscopic peaks and/or valleys, pockets, and voids that contribute to the excellent hardness and wear-resistance of the first layer 18, but also may contribute to an unacceptable coefficient of friction of the first layer 18. Therefore, the second layer 20 may smooth such peaks and valleys to provide the coating 16 with excellent lubricity.

The second layer 20 may have a thickness that is less than or equal to 50% of a thickness of the first layer 18. That is, the first layer 18 may be comparatively thicker than the second layer 20. Specifically, the second layer 20 may have a thickness of from 0.1 to 1.5 microns. In one example, the second layer 20 may have a thickness of from 0.2 to 1 micron. Further, the second layer 20 may have a hardness of from 10 to 25 GPa.

Additionally, the coating 16 may further include a plurality of first layers 18 and a plurality of second layers 20. That is, in one example, the coating 16 may include alternating first and second layers 18, 20, as long as at least one second layer 20 is disposed on at least one first layer 18.

The resulting coating 16 exhibits excellent tribological properties and performance. That is, the coating 16 has a hardness of from 10 to 20 GPa and a coefficient of friction of less than or equal to 0.12. Therefore, the coating 16 is unexpectedly useful for simultaneously reducing friction and wear between surfaces and/or components. More specifically, the coating 16 exhibits excellent hardness and anti-wear performance, and is suitable for components requiring a minimal coefficient of friction. Further, as compared to existing wear-reducing coatings, the coating 16 mitigates any valleys, pockets, and/or voids to provide a smooth surface 12, 14. Therefore, the coating 16 minimizes micro-cutting and abrasion at an interface between components and consequently minimizes friction between such components.

Further, as compared to existing friction-reducing coatings, the coating 16 exhibits excellent hardness. Therefore, the coating 16 provides excellent wear resistance for components and devices 10, 110, 210 requiring durability and reliability. In particular, the coating 16 may have a wear rate of less than or equal to $2\times10^{-7}$ mm$^3$/N·m as measured in accordance with ASTM G99-05.

Additionally, the coating 16 exhibits excellent thermal resistance and may not substantially degrade at a temperature of less than or equal to 1,000° C. That is, the coating 16 may not substantially degrade, e.g., melt, chip, wear, gouge, or pit, at a temperature of less than or equal to 1,000° C. Stated differently, the coating 16 may not substantially chemically or physically degrade under such operating conditions. Therefore, the coating 16 may be useful for applications requiring operating temperatures of from 400 to 1,000° C. Further, the coating 16 contributes to an excellent hydraulic fluid film for devices 10, 110, 210 configured for converting energy.

Referring again to FIGS. 1 and 2, in one example, the device 10 may be a vane pump including a vane 22 (FIG. 2) disposed within a ring 24. The vane pump 10 may be any suitable vane pump known in the art and may be a fixed displacement pump or a variable displacement pump. For example, referring to FIGS. 1 and 2, the vane pump 10 may be a variable displacement pump including at least one vane 22 mounted to a rotor 26 that rotates against the ring 24 inside a cavity of the vane pump 10.

The first surface 12 and the second surface 14 may be any suitable surface of the vane pump 10. For example, referring to FIGS. 2 and 2A, at least one of the first surface 12 and the second surface 14 may be an edge 28, 28A of the vane 22. Similarly, referring to FIGS. 2 and 2B, at least one of the first surface 12 and the second surface 14 may be a surface of the ring 24 of the vane pump 10. Stated differently, in one example, the first surface 12 of the device 10 may be the surface of the ring 24 and the second surface 14 may be the surface of the vane 22 that is configured for moving with respect to the surface of the ring 24.

Figure 2A:
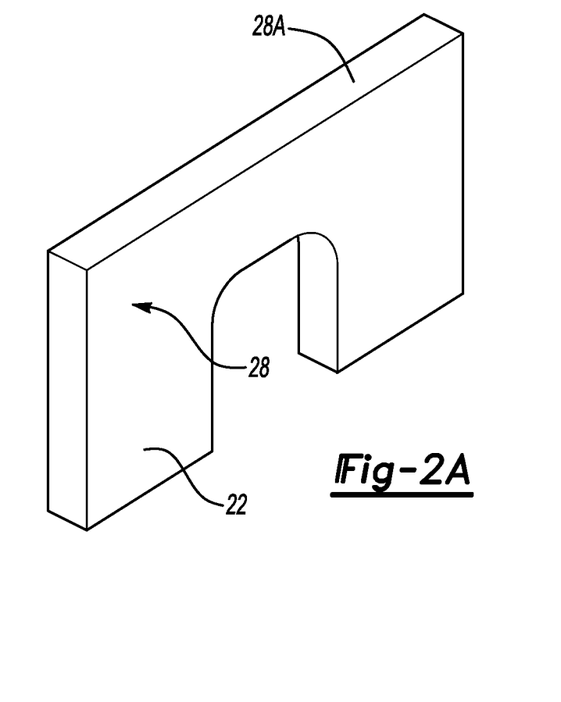
FIG. 2A is a schematic perspective view of the vane of FIG. 2.
Figure 2B:
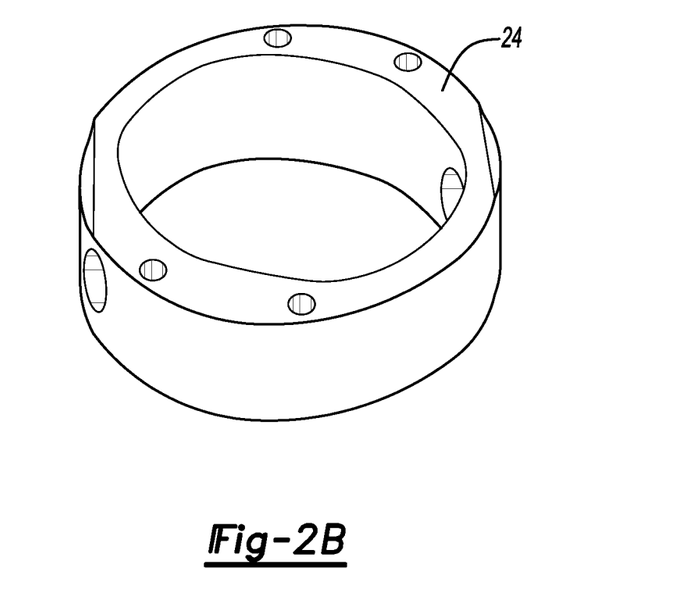
FIG. 2B is a schematic perspective view of the ring of FIG. 2.

Referring to FIGS. 2 and 2A, each vane 22 of the vane pump 10 may be generally rectangular in shape and therefore may include a plurality of edges 28, 28A that are configured for contacting the ring 24 of the vane pump 10 during operation. The coating 16 may be disposed on one or more edges 28, 28A of the vane 22. For example, the coating 16 may be disposed on a distal edge 28A of the vane 22 that contacts the ring 24 during operation. Or, referring to FIG. 2, the coating 16 may be disposed on one or more lateral edges 28 of the vane 22 so as to effect efficient sliding against a plate 30 (FIG. 2) of the vane pump 10. Alternatively, the coating 16 may be disposed on every surface of the vane 22 so as to coat the entire vane 22.

The mechanical efficiency of the vane pump 10 may increase by at least 2% when operated at a pressure of from 250 to 2,500 psi as compared to a vane pump that is substantially free from the coating 16. That is, since the coating 16 has a coefficient of friction of less than or equal to 0.12, the mechanical efficiency of the vane pump 10 may increase as the vane 22 efficiently slides over the ring 24. Therefore, the vane pump 10 may be substantially free from gouging, e.g., ring burn, after operating at a speed of about 1,800 rpm at a pressure of from 250 to 3,000 psi and a temperature of from 150 to 165° F. for approximately 240 minutes.

Additionally, since the coating 16 reduces friction between the first surface 12 and the second surface 14 of the vane pump 10, the vane pump 10 may not require sulfur and/or phosphorus hydraulic fluid additives to generate protective sulfites and/or phosphates on the surfaces 12, 14 of the vane pump 10 during a break-in period. Thus, the vane pump 10 exhibits an excellent power density.

Referring now to FIG. 3, in another example, the device 110 may be an axial piston pump including a plate 30 and a piston 32 that is disposed within a cylinder barrel 34 and adjacent a piston shoe 36. The axial piston pump 110 may be any suitable axial piston pump known in the art and may be an open circuit pump, a closed circuit pump, a fixed displacement pump, a variable displacement pump, or combinations thereof. For example, referring to FIG. 3, the axial piston pump 110 may be a fixed displacement pump including a plurality of pistons 32 disposed within a plurality of respective cylinder barrels 34 of a rotatable cylinder block 38. The plurality of pistons 32 may reciprocate parallel to a drive shaft 40 of the axial piston pump 110 and engage with the plate 30, e.g., a swash plate, of the axial piston pump. Further, the rotatable cylinder block 38 may mate and rotate with respect to a stationary valve plate 130.

The first surface 12 and the second surface 14 may be any suitable surface of the axial piston pump 110. For example, referring to FIG. 3, at least one of the first surface 12 and the second surface 14 may be a surface of the piston 32 of the axial piston pump 110. Similarly, at least one of the first surface 12 and the second surface 14 may be a surface of the cylinder barrel 34 of the axial piston pump 110. Stated differently, in one example, the first surface 12 of the device 110 may be a surface of the cylinder barrel 34, in particular, a bore 42 of the cylinder barrel 34, and the second surface 14 may be a surface of the piston 32 that is disposed within and configured for moving with respect to the bore 42 of the cylinder barrel 34. In operation, the coating 16 disposed on at least one of the surface of the piston 32 and the bore 42 of the cylinder barrel 34 may increase the mechanical efficiency of the axial piston pump 110. More specifically, as the piston 32 translates into and out of the bore 42 of the cylinder barrel 34, an angle of the swash plate 30 changes. The angle affects an axial force on the piston 32 and results in angular moments at both a distal end of the piston 32 (within the bore 42 of the cylinder barrel 34), and at a proximal end of the piston 32 (external to a proximal end of the cylinder barrel 34). The coating 16 reduces friction at each of the aforementioned piston 32—cylinder barrel 34 interfaces and thus improves mechanical efficiency of the axial piston pump 110.

In another example, referring again to FIG. 3, at least one of the first surface 12 and the second surface 14 may be a surface of the piston shoe 36 of the axial piston pump 110. Stated differently, in this example, the first surface 12 of the device 110 may be the surface of the piston shoe 36 and the second surface 14 may be the surface of the piston 32 that is configured for moving with respect to the piston shoe 36. In operation, the coating 16 disposed on at least one of the surface of the piston shoe 36 and the surface of the piston 32 may increase the mechanical efficiency of the axial piston pump 110. More specifically, the piston shoe 36 circumscribes the proximal end of the piston 32 as a ball-and-socket joint according to the movement of the swash plate 30. The coating 16 disposed on at least one of the proximal end of the piston 32 and the surface of the piston shoe 36 may replace brass. Such replacement may reduce manufacturing time and costs for the axial piston pump 110. Further, the coating 16 may reduce friction at the aforementioned piston 32—piston shoe 36 interface and thus improve mechanical efficiency of the axial piston pump 110.

In yet another example, referring again to FIG. 3, at least one of the first surface 12 and the second surface 14 may be a surface of the plate 30, e.g., the swash plate or the stationary valve plate 130, of the axial piston pump 110. In particular, in this example, the first surface 12 of the device 110 may be a surface of the stationary valve plate 130 and the second surface 14 may be the surface of the cylinder barrel 34 that is configured for moving, via the rotatable cylinder block 38, with respect to the surface of the stationary valve plate 130. In operation, the coating 16 disposed on at least one of the surface of the stationary valve plate 130 and the surface of the cylinder barrel 34 may also increase the mechanical efficiency of the axial piston pump 110. More specifically, the stationary valve plate 130 and the cylinder barrel 34 experience high relative velocities and are generally formed from sintered bronze. The coating 16 disposed on at least one of the surface of the stationary valve plate 130 and the surface of the cylinder barrel 34 may replace the sintered bronze. Such replacement may reduce manufacturing time and costs for the axial piston pump 110. Further, the coating 16 may reduce friction at the aforementioned stationary valve plate 130—cylinder barrel 34 interface and thus improve mechanical efficiency of the axial piston pump 110.

Alternatively, referring to FIG. 3, in a fourth example, the first surface 12 of the device 110 may be a surface of the piston shoe 36 and the second surface 14 may be a surface of the swash plate 30 that is configured for moving with respect to the surface of the piston shoe 36. In operation, the coating 16 disposed on at least one of the surface of the piston shoe 36 and the surface of the swash plate 30 may also increase the mechanical efficiency of the axial piston pump 110. The coating 16 disposed on at least one of the surface of the piston shoe 36 and the surface of the swash plate 30 may reduce metal-on-metal contact. That is, the coating 16 may reduce friction at the aforementioned piston shoe 36—swash plate 30 interface and thus improve mechanical efficiency of the axial piston pump 110.

Depending upon a selection of the aforementioned coated surfaces 12, 14, the mechanical efficiency of the axial piston pump 110 may be greater than or equal to 90% when operated at a pressure up to 6,000 psi and a speed of from 600 to 3,800 rpm. That is, since the coating 16 has a coefficient of friction of less than or equal to 0.12, the mechanical efficiency of the axial piston pump 110 may increase as the aforementioned interfaces contact and efficiently translate and/or rotate with respect to each other. The axial piston pump 110 may have a mechanical efficiency of greater than or equal to 90%.

Figure 4A:
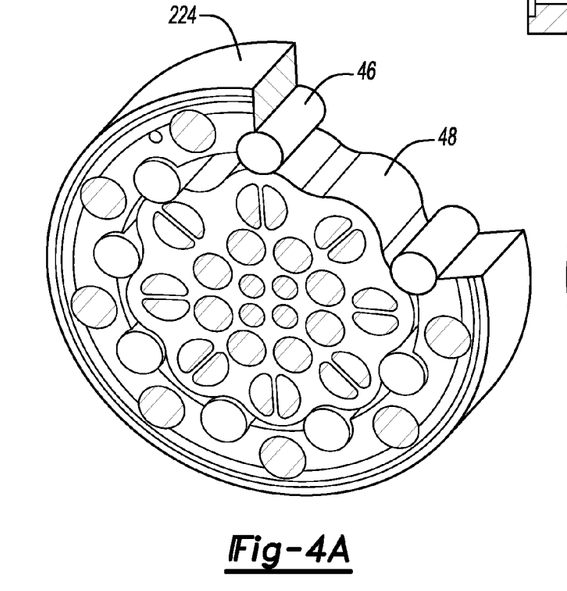
FIG. 4A is a schematic perspective view of a roller and a ring of the orbital motor of FIG. 4.
Figure 4B:
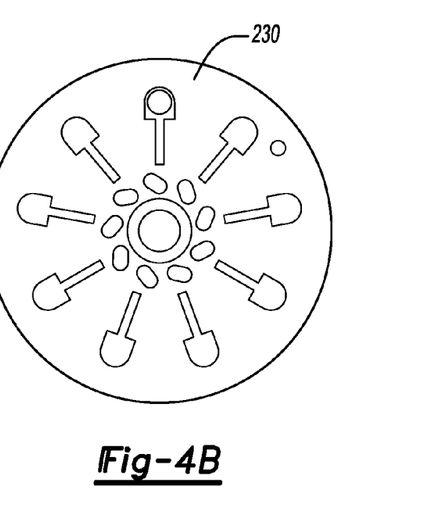
FIG. 4B is a schematic cross-sectional view of a plate of the orbital motor of FIG. 4.

Referring now to FIGS. 4, 4A, and 4B, in another example, the device 210 may be an orbital motor that is configured to be driven by a drive 44. For example, the orbital motor 210 may include a roller 46 and a valve 48 that are each disposed within a ring 224 that is adjacent a plate 230. The orbital motor 210 may be any suitable orbital motor known in the art and may be, for example, a low-speed, high-torque orbital motor, such as, but not limited to, gerolers, gerotors, radial piston motors, and cam lobe motors. Further, the orbital motor 210 may be a high-speed, low-torque orbital motor, such as, but not limited to, axial piston motors and vane motors. For example, referring to FIGS. 4A and 4B, the orbital motor 210 may include a plurality of rollers 46 disposed between the valve 48, e.g., a star valve, and the ring 224. The ring 224 may in turn be disposed against a plate 230, e.g., a stationary valve plate, of the orbital motor 210. In operation, commutating valving action is accomplished at an interface between the orbiting and rotating star valve 48 and the plate 230.

The first surface 12 and the second surface 14 may be any suitable surface of the orbital motor 210. For example, referring to FIGS. 4 and 4A, at least one of the first surface 12 and the second surface 14 may be a surface of the roller 46. Similarly, at least one of the first surface 12 and the second surface 14 may be a surface of the valve 48. Stated differently, in one example, the first surface 12 of the device 210 may be the surface of the valve 48 and the second surface 14 may be the surface of the roller 46 that is configured for moving with respect to the surface of the valve 48. In operation, the coating 16 disposed on at least one of the surface of the roller 46 and the surface of the valve 48 may increase the mechanical efficiency of the orbital motor 210. More specifically, as one or more rollers 46 rotates with respect to the valve 48, the coating 16 reduces friction at the roller 46—valve 48 interface and consequently improves the mechanical efficiency of the orbital motor 210.

In another example, referring again to FIG. 4A, at least one of the first surface 12 and the second surface 14 may be a surface of the ring 224 of the orbital motor 210. Stated differently, in this example, the first surface 12 of the device 210 may be the surface of the ring 224 and the second surface 14 may be the surface of the roller 46 that is configured for moving with respect to the surface of the ring 224. In operation, the coating 16 disposed on at least one of the surface of the roller 46 and the surface of the ring 224 may increase the mechanical efficiency of the orbital motor 210. More specifically, as one or more rollers 46 rotates with respect to the ring 224, the coating 16 reduces friction at the roller 46—ring 224 interface and consequently improves the mechanical efficiency of the orbital motor 210.

In yet another example, referring again to FIG. 4B, at least one of the first surface 12 and the second surface 14 may be a surface of the plate 230 of the orbital motor 210. Likewise, at least one of the first surface 12 and the second surface 14 may be the surface of the valve 48. In particular, in this example, the first surface 12 of the device 210 may be the surface of the stationary valve plate 230 and the second surface 14 may be the surface of the valve 48 that is configured for moving with respect to the surface of the stationary valve plate 230. In operation, the coating 16 disposed on at least one of the surface of the stationary valve plate 230 and the surface of the valve 48 may also increase the mechanical efficiency of the orbital motor 210. More specifically, as the valve 48 rotates with respect to the stationary valve plate 230, the coating 16 reduces friction at the valve 48—plate 230 interface and consequently improves the mechanical efficiency of the orbital motor 210.

In another example, referring again to FIG. 4B, at least one of the first surface 12 and the second surface 14 may be a surface of the roller 46. Similarly, at least one of the first surface 12 and the second surface 14 may be a surface of the stationary valve plate 230. Stated differently, in one example, the first surface 12 of the device 210 may be the surface of the stationary valve plate 230 and the second surface 14 may be the surface of the roller 46 that is configured for moving with respect to the surface of the stationary valve plate 230. In operation, the coating 16 disposed on at least one of the surface of the roller 46 and the surface of the stationary valve plate 230 may increase the mechanical efficiency of the orbital motor 210. More specifically, as one or more rollers 46 rotates with respect to the stationary valve plate 230, the coating 16 reduces friction at the roller 46—plate 230 interface and consequently improves the mechanical efficiency of the orbital motor 210.

In yet another example, referring again to FIGS. 4A and 4B, at least one of the first surface 12 and the second surface 14 may be a surface of a plate 330, e.g., a balance plate, of the orbital motor 210. Likewise, at least one of the first surface 12 and the second surface 14 may be the surface of the valve 48. In particular, in this example, the first surface 12 of the device 210 may be the surface of the balance plate 330 and the second surface 14 may be the surface of the valve 48 that is configured for moving with respect to the surface of the balance plate 330. In operation, the coating 16 disposed on at least one of the surface of the balance plate 330 and the surface of the valve 48 may also increase the mechanical efficiency of the orbital motor 210. More specifically, as the valve 48 rotates with respect to the balance plate 330, the coating 16 reduces friction at the valve 48—plate 330 interface and consequently improves the mechanical efficiency of the orbital motor 210.

In yet another example, referring again to FIG. 4B, at least one of the first surface 12 and the second surface 14 may be a surface of the roller 46 of the orbital motor 210. Likewise, at least one of the first surface 12 and the second surface 14 may be the surface of the balance plate 330. In particular, in this example, the first surface 12 of the device 210 may be the surface of the balance plate 330 and the second surface 14 may be the surface of the roller 46 that is configured for moving with respect to the surface of the balance plate 330. In operation, the coating 16 disposed on at least one of the surface of the balance plate 330 and the surface of the roller 46 may also increase the mechanical efficiency of the orbital motor 210. More specifically, as the roller 46 rotates with respect to the balance plate 330, the coating 16 reduces friction at the roller 46—plate 330 interface and consequently improves the mechanical efficiency of the orbital motor 210.

In another example, referring again to FIG. 4B, at least one of the first surface 12 and the second surface 14 may be a surface of the drive 44 of the orbital motor 210. Likewise, at least one of the first surface 12 and the second surface 14 may be the surface of the valve 48. In particular, in this example, the first surface 12 of the device 210 may be the surface of the valve 48 and the second surface 14 may be the surface of the drive 44 that is configured for moving with respect to the surface of the valve 48. In operation, the coating 16 disposed on at least one of the surface of the valve 48 and the surface of the drive 44 may also increase the mechanical efficiency of the orbital motor 210. More specifically, as the drive 44 rotates with respect to the valve 48, the coating 16 reduces friction at the valve 48—drive 44 interface and consequently improves the mechanical efficiency of the orbital motor 210.

The mechanical efficiency at start-up of the orbital motor 210 may increase by at least 4% as compared to an orbital motor that is substantially free from the coating 16 including X present in an amount greater than 0 parts by weight based on 100 parts by weight of the ceramic alloy. That is, when the ceramic alloy is, for example, $AlMgB_{14}$—$TiB_2$, the mechanical efficiency at start-up of the orbital motor 210 may increase by at least 4% as compared to an orbital motor that is substantially free from the coating 16. Since the coating 16 has a coefficient of friction of less than or equal to 0.12, the mechanical efficiency of the orbital motor 210 may increase as the aforementioned interfaces contact and efficiently translate and/or rotate with respect to each other. Further, the coating 16 may contribute to an increased start-up mechanical efficiency and enable a comparatively smaller orbital motor 210, with accompanying energy savings, or enable delivering higher torque for a given orbital motor 210.

The device 10, 110, 210 exhibits reduced friction between surfaces and reduced wear during operation as compared to existing devices. Therefore, as compared to existing devices, the device 10, 110, 210 requires less torque at start-up, has excellent start-up mechanical efficiency, operates over a larger range of pressure, and has excellent power density. Further, the device 10, 110, 210 requires minimal hydraulic fuel additives, is smaller, and consumes less energy for a given torque output as compared to existing devices. Additionally, for applications requiring non-petroleum-based hydraulic fluid, the device 10, 110, 210 operates over a larger range of speed and pressure as compared to existing devices. Finally, the device 10, 110, 210 minimizes component degradation, such as ring burn.

A method of reducing friction between the first surface 12 and the second surface 14 includes forming the first layer 18 on at least one of the first surface 12 and the second surface 14. In preparation for forming the first layer 18, the method may also include cleaning at least one of the first surface 12 and the second surface 14. The first surface 12 and/or the second surface 14 may be, for example, metal, and may be cleaned to prepare the first surface 12 and/or the second surface 14 to accept the coating 16. More specifically, cleaning the first surface 12 and/or the second surface 14 generally removes dirt, grease, flash rust, and/or surface oxidation.

Cleaning may include washing the first surface 12 and/or the second surface 14 in a solvent, such as acetone, to remove any surface contaminants. Cleaning the first surface 12 and/or the second surface 14 may also include soaking the first surface 12 and/or the second surface 14 in an ultrasonic cleaning solution heated to a temperature of from about 100 to 150° C. for approximately 10 minutes. Next, the first surface 12 and/or the second surface 14 may be rinsed in water at ambient temperature for approximately 5 minutes and in de-ionized water at ambient temperature for from 5 to 10 minutes. The first surface 12 and/or the second surface 14 may then be air dried via compressed air. The first surface 12 and/or the second surface 14 may again be rinsed in a solvent, such as acetone. Then, the first surface 12 and/or the second surface 14 may be heated in an enclosed chamber to a temperature of from 38 to 65° C. for at least 1 hour. To ensure proper cleaning, a visual inspection of the first surface 12 and/or second surface 14 may be performed after the first surface 12 and/or the second surface 14 is removed from the enclosed chamber.

For some surfaces, the method may also include heating the first surface 12 and/or the second surface 14 prior to cleaning. Heating the first surface 12 and/or the second surface 14 prior to cleaning enables degassing of the first surface 12 and/or the second surface 14. For example, for applications including a cemented tungsten carbide surface, the first surface 12 and/or the second surface 14 may be heated in the chamber to from 300 to 400° C. for at least 15 minutes. In one example, the first surface 12 and/or the second surface 14 may be heated to about 350° C. for about 45 minutes. During heating, the pressure of the chamber may be held below 2 mPa.

Cleaning may further be defined as etching the first surface 12 and/or the second surface 14. In particular, the first surface 12 and/or the second surface 14 may be cleaned via radio frequency (RF) etching in a vacuum to prepare the first surface 12 and/or the second surface 14 to accept the coating 16. The first surface 12 and/or the second surface 14 may be etched in a vacuum chamber at a temperature of from 100 to 300° C. The etching temperature is generally selected according to a composition of the material of the first surface 12 and/or the second surface 14. For example, for ferrous surfaces that may experience tempering at elevated coating temperatures, etching may be performed at about 150° C. An inert gas such as argon or krypton may be selected to purge the atmosphere in the chamber and etch the first surface 12 and/or the second surface 14. Partial pressure of the chamber may be from 100 to 300 mPa, e.g., about 200 mPa, during etching. Etching may occur at an applied power of from 800 to 1,600 W, e.g., about 1,200 W. Depending upon a complexity of the shape of the first surface 12 and/or the second surface 14, the first surface 12 and/or the second surface 14 may be etched for from approximately 0.5 to 3 hours, e.g., for from 1 to 2 hours. However, longer etching times may be also be suitable. Again, to ensure proper cleaning, a visual inspection of the first surface 12 and/or the second surface 14 may be performed after the first surface 12 and/or the second surface 14 is etched to ensure that no arcing has occurred.

Referring again to forming, the first layer 18 is formed on the first surface 12 and/or the second surface 14 in preparation for the second layer 20, as set forth in more detail below. Depending upon the material of the first surface 12 and/or the second surface 14, a bond layer may also exist between the first layer 18 and the first surface 12 and/or the second surface 14. For example, the bond layer may include chromium or chromium nitride and may assist in bonding the first layer 18 to the first surface 12 and/or second surface 14.

In particular, forming may be further defined as physical vapor depositing the first layer 18 on the first surface 12 and/or the second surface 14. Any suitable physical vapor deposition technique may be used to form the first layer 18. For example, unbalanced magnetron sputtering, arc evaporation, electron beam (EB) evaporation, and pulsed laser deposition may be used to form the first layer 18.

More specifically, physical vapor depositing may be further defined as sputtering the first surface 12 and/or the second surface 14 with a target material represented by the general formula $AlMgB_{14}$—X, wherein X is defined as set forth above. As used herein, the terminology sputtering is used to represent a technique of removing atomized material from a solid via energetic bombardment of the material by ions or neutral particles. In a typical sputtering process, an inert gas such as argon or krypton is introduced into a chamber to induce a gaseous plasma under a vacuum. Depending upon the temperature sensitivity of the components being coated, sputtering may occur at a temperature of from 100 to 300° C. at a partial pressure of from 300 to 600 mPa for from 1 to 5 hours. Further, sputtering may occur at a power of from 1,000 to 3,000 W. e.g., 1,200 W, so that thermal stresses and/or cracking of the target material may be minimized.

During sputtering, ions from a gaseous plasma are accelerated to bombard the target. The target is eroded by the ions via energy transfer and ejects neutral and charged particles such as individual or clustered atoms or molecules. The ejected neutral and charged particles then contact the first surface 12 and/or the second surface 14 and form a film, i.e., the first layer 18, on the first surface 12 and/or the second surface 14. A suitable physical vapor deposition unit is commercially available under the trade name CC800®/8 from CemeCon of Würselen, Germany.

The method also includes depositing the second layer 20 including carbon onto the first layer 18 to thereby form the coating 16 on at least one of the first surface 12 and the second surface 14 that reduces friction between the first surface 12 and the second surface 14. Depositing may be further defined as increasing a concentration of carbon in the second layer 20 with a distance from the first layer 18 so that carbon is present is the second layer 20 in a gradient concentration. That is, the concentration of carbon in the second layer 20 may increase with increasing distance from the first layer 18. Therefore, the concentration of carbon at a distal edge of the second layer 20 may be larger than the concentration of carbon at the interface between the first layer 18 and the second layer 20. For applications requiring excellent lubricity, such as a surface for surface break-in, the concentration of carbon may reach 90% at the distal edge of the second layer 20.

In one example, depositing may be further defined as sputtering the first layer 18 with a target material including carbon. That is, as the solid target including carbon is bombarded by energized ions, carbon atoms are expelled from the carbon target and deposit the second layer 20. To effect such deposition, one or more carbon targets may be installed in the chamber with the one or more $AlMgB_{14}$—X targets. After the first layer 18 is formed to the desired thickness as set forth above, power supplied to the $AlMgB_{14}$—X targets is gradually reduced while power supplied to the carbon targets is gradually increased. As a result, the second layer 20 is deposited on the formed first layer 18 to form the coating 16. Stated differently, a composition of the coating 16 gradually changes from substantially pure $AlMgB_{14}$—X to substantially carbon to form the first layer 18 and second layer 20, respectively, i.e., the coating 16 on the first surface 12 and/or the second surface 14. Therefore, the desired thickness of the second layer 20 may be controlled by adjusting power supplied to the carbon targets over time.

In another example, depositing may be further defined as decomposing a carbon-based gas in the presence of the first layer 18. Suitable carbon-based gases include, but are not limited to, acetylene and methane. In this example, the carbon-based gas is introduced into the chamber to deposit the second layer 20. A growth of the second layer 20 may be controlled by the carbon-based gas flow rate. After the first layer 18 is formed to the desired thickness as set forth above, power to the $AlMgB_{14}$—X targets is gradually decreased as the carbon-based gas is introduced into the chamber at a gradually increasing flow rate. For example, the flow rate of the carbon-based gas may be increased from 10 to 150 ml/min, e.g., from 10 to 125 ml/min or from 10 to 100 ml/min, over time. The flow rate may be increased from about 0.5 ml/40 seconds to about 0.5 ml/20 seconds to about 0.5 ml/8 seconds. As the flow rate of the carbon-based gas increases, the power supplied to the $AlMgB_{14}$—X targets may be simultaneously decreased to from 1,500 to 100 W. Generally, depositing may occur at a temperature of less than or equal to 200° C. without any external heating source.

Due to an inert gas enriched-plasma environment in the chamber and a negative bias voltage applied to the first surface 12 and/or the second surface 14, the carbon-based gas decomposes so that amorphous carbon is deposited on top of the first layer 18. Stated differently, since the power supplied to the $AlMgB_{14}$—X targets is gradually reduced and a concentration of the carbon-based gas in the chamber is gradually increased, a composition of the coating 16 gradually changes from substantially pure $AlMgB_{14}$—X to substantially carbon to form the first layer 18 and second layer 20, respectively, i.e., the coating 16 on the first surface 12 and/or the second surface 14. Therefore, the method reduces friction and wear between the first surface 12 and the second surface 14.

The following examples are meant to illustrate the invention and are not to be viewed in any way as limiting to the scope of the invention.

EXAMPLES

In preparation for evaluating a performance of a series of vane pumps, axial piston pumps, and valve-in-star motors, six coatings are formed on six surfaces according to the Reference Examples and Comparative Reference Examples set forth below.

Reference Example A

In preparation for coating an M2 steel surface with a coating of Reference Example A, the M2 steel surface, two $AlMgB_{14}$ targets, and two solid carbon targets are placed into a chamber of a CemeCon CC008®/8 physical vapor deposition unit supplied with argon gas. Heating elements within the chamber are supplied with approximately 2,000 W to heat the M2 steel surface to approximately 300° C. for 1 hour. During heating, pressure within the chamber is maintained at 8 mPa.

In preparation for etching the M2 steel surface, the chamber is supplied with radio frequency power at 1,200 W for 1 hour. The M2 steel surface is etched with argon gas having a flow rate of 75 ml/min. During etching, pressure within the chamber is maintained at 250 mPa.

To form a first layer of the coating on the M2 steel surface, the two $AlMgB_{14}$ targets are supplied with 1,500 W of power. During forming, argon gas is supplied to the chamber at a flow rate of 250 ml/min. The resulting first layer is formed at a rate of 0.6 microns/hour.

To deposit a second layer on the first layer and thereby form the coating of Reference Example A, the two carbon targets are supplied with power increasing from 100 to 2,000 W as power supplied to the two $AlMgB_{14}$ targets is ramped down from 1,500 to 100 W. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Reference Example A.

Reference Example B

In preparation for coating an M2 steel surface with a coating of Reference Example B, the M2 steel surface and four $AlMgB_{14}$ targets are placed into the chamber of the CemeCon CC008®/8 physical vapor deposition unit supplied with separate streams of argon and acetylene gas. Heating elements within the chamber are supplied with approximately 2,000 W of power to heat the M2 steel surface to approximately 300° C. for 1 hour. During heating, pressure within the chamber is maintained at 8 mPa.

In preparation for etching the M2 steel surface, the chamber is supplied with radio frequency power at 1,200 W for 1 hour. The M2 steel surface is etched with argon gas having a flow rate of 75 ml/min. During etching, pressure within the chamber is maintained at 250 mPa.

To form a first layer of the coating on the M2 steel surface, the four $AlMgB_{14}$ targets are supplied with 1,500 W of power. During forming, argon gas is supplied to the chamber at a flow rate of 250 ml/min. The resulting first layer is formed at a rate of about 1.0 microns/hour.

To deposit a second layer on the first layer and thereby form the coating of Reference Example B, the power supplied to the four $AlMgB_{14}$ targets is ramped down from 1,500 to 100 W as acetylene gas is introduced to the chamber at a gradually increasing flow rate over the range of 10 to 125 ml/min. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Reference Example B.

Reference Example C

In preparation for coating an M2 steel surface with a coating of Reference Example C, the M2 steel surface, two $AlMgB_{14}$—$TiB_2$ targets, and two solid carbon targets are placed into the chamber of the CemeCon CC008®/8 physical vapor deposition unit supplied with argon gas. Heating elements within the chamber are supplied with approximately 2,000 W to heat the M2 steel surface to approximately 300° C. for 1 hour. During heating, pressure within the chamber is maintained at 8 mPa.

In preparation for etching the M2 steel surface, the chamber is supplied with radio frequency power at 1,200 W for 1 hour. The M2 steel surface is etched with argon gas having a flow rate of 75 ml/min. During etching, pressure within the chamber is maintained at 250 mPa.

To form a first layer of the coating on the M2 steel surface, the two $AlMgB_{14}$—$TiB_2$ targets are supplied with 1,500 W of power. During forming, argon gas is supplied to the chamber at a flow rate of 250 ml/min. The resulting first layer is formed at a rate of about 0.6 microns/hour.

To deposit a second layer on the first layer and thereby form the coating of Reference Example C, the two carbon targets are supplied with increasing power of from 100 to 2,000 W as power supplied to the two $AlMgB_{14}$—$TiB_2$ targets is ramped down from 1,500 to 100 W. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Reference Example C.

Reference Example D

In preparation for coating an M2 steel surface with a coating of Reference Example D, the M2 steel surface and four $AlMgB_{14}$—$TiB_2$ targets are placed into the chamber of the CemeCon CC008®/8 physical vapor deposition unit supplied with separate streams of argon and acetylene gas. Heating elements within the chamber are supplied with approximately 2,000 W to heat the M2 steel surface to approximately 300° C. for 1 hour. During heating, pressure within the chamber is maintained at 8 mPa.

In preparation for etching the M2 steel surface, the chamber is supplied with radio frequency power at 1,200 W for 1 hour. The M2 steel surface is etched with argon gas having a flow rate of 75 ml/min. During etching, pressure within the chamber is maintained at 250 mPa.

To form a first layer of the coating on the M2 steel surface, the four $AlMgB_{14}$—$TiB_2$ targets are supplied with 1,500 W of power. During forming, argon gas is supplied to the chamber at a flow rate of 250 ml/min. The resulting first layer is formed at a rate of about 1.0 microns/hour.

To deposit a second layer on the first layer and thereby form the coating of Reference Example D, the power supplied to the four $AlMgB_{14}$—$TiB_2$ targets is ramped down from 1,500 to 100 W as acetylene gas is introduced to the chamber at a gradually increasing flow rate over the range of 10 to 125 ml/min. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Reference Example D.

Comparative Reference Example E

In preparation for coating an M2 steel surface with a coating of Comparative Reference Example E, the M2 steel surface and four $AlMgB_{14}$ targets are placed into the chamber of the CemeCon CC008®/8 physical vapor deposition unit supplied with argon gas. Heating elements within the chamber are supplied with approximately 2,000 W of power to heat the M2 steel surface to approximately 300° C. for 1 hour. During heating, pressure within the chamber is maintained at 8 mPa.

In preparation for etching the M2 steel surface, the chamber is supplied with radio frequency power at 1,200 W for 1 hour. The M2 steel surface is etched with argon gas having a flow rate of 75 ml/min. During etching, pressure within the chamber is maintained at 250 mPa.

To form the coating of Comparative Reference Example E on the M2 steel surface, the four $AlMgB_{14}$ targets are supplied with 1,500 W of power. During forming, argon gas is supplied to the chamber at a flow rate of 250 ml/min. The resulting coating of Comparative Reference Example E is formed at a rate of about 1.0 microns/hour.

Comparative Reference Example F

In preparation for coating an M2 steel surface with a coating of Comparative Reference Example F, the M2 steel surface and four $AlMgB_{14}$—$TiB_2$ targets are placed into the chamber of the CemeCon CC008®/8 physical vapor deposition unit supplied with argon gas. Heating elements within the chamber are supplied with approximately 2,000 W to heat the M2 steel surface to approximately 300° C. for 1 hour. During heating, pressure within the chamber is maintained at 8 mPa.

In preparation for etching the M2 steel surface, the chamber is supplied with radio frequency power of 1,200 W for 1 hour. The M2 steel surface is etched with argon gas having a flow rate of 75 ml/min. During etching, pressure within the chamber is maintained at 250 mPa.

To form the coating of Comparative Reference Example F on the M2 steel surface, the four $AlMgB_{14}$—$TiB_2$ targets are supplied with 1,500 W of power. During forming, argon gas is supplied to the chamber at a flow rate of 250 ml/min. The resulting coating of Comparative Reference Example F is formed at a rate of about 1.0 microns/hour.

Example 1

Vane Pump

Six vane pumps, each including a plurality of vanes, are provided for evaluation. Each of the vanes of one vane pump is coated with the coating of Reference Example A as set forth above to prepare the vane pump of Example 1A. Likewise, each of the vanes of a second vane pump is coated with the coating of Reference Example B as set forth above to prepare the vane pump of Example 1B. Similarly, each of the vanes of the remaining four vane pumps is coated with the coatings of Reference Examples C-D and Comparative Reference Examples E-F, respectively, as set forth above to prepare the vane pumps of Examples 1C-1D and Comparative Examples 1E-1F. The six vane pumps are then operated at 1,800 rpm in Mobil DTE 24 oil at a temperature of 80° C. and a pressure of 2,500 psi for 250 hours. The six vane pumps are then operated at 3,000 psi for 4 hours. The vanes are then visually inspected for wear and rated as acceptable or unacceptable.

Additionally, a coefficient of friction of the coatings is measured using a pin-on-disk test. More specifically, a pin having a tip radius of 4.7625 mm under a load of 60.33N is rotated at a speed of 0.9 m/s for a distance of 1,000 m along a round disk sample of each of the coated vanes. A wear rate is also calculated for the coatings of Reference Examples C-D and Comparative Reference Example F based on operation of the vane pumps in Houghto-Safe® 419-R water glycol hydraulic fluid, commercially available from Houghton International Inc. of Valley Forge, Pa. Finally, the coatings of Reference Examples A-D and Comparative Reference Examples E-F are measured for hardness according to the Knoop hardness test. The results of each of the aforementioned tests are summarized below in Table 1.

TABLE 1

| | Coating Performance | | | |
|---|---|---|---|---|
| Coating | Coating Summary | Hardness (GPa) | Coefficient of Friction | Wear Rate $(mm^3/N \cdot m)$ |
| Ref. Ex. A | $AlMgB_{14}$ + C (sputter) | 10-20 | ≤0.12 | — |
| Ref. Ex. B | $AlMgB_{14}$ + C (gas) | 10-20 | ≤0.12 | — |
| Ref. Ex. C | $AlMgB_{14}$—$TiB_2$ + C (sputter) | 10-20 | ≤0.12 | ≤2 × $10^{-7}$ |
| Ref. Ex. D | $AlMgB_{14}$—$TiB_2$ + C (gas) | 10-20 | ≤0.12 | ≤2 × $10^{-7}$ |
| Comp. Ref. Ex. E | $AlMgB_{14}$ | 17-34 | 0.13-0.18 | — |
| Comp. Ref. Ex. F | $AlMgB_{14}$—$TiB_2$ | 13-30 | 0.08-0.14 | ≤1 × $10^{-7}$ |

The six vane pumps of Examples 1A-1D and Comparative Examples 1E-1F are also subjected to a step load test in which pressure and force applied to a vane-ring interface of the six vane pumps is gradually increased according to the parameters summarized below in Table 2.

TABLE 2

Vane Pump Step Load Test Parameters

| Speed (rpm) | Pressure (psi) | Time (min) | Force on Vane-Ring (lb$_f$) | Temperature (° C.) |
|---|---|---|---|---|
| 1800 | min | 6 | 10 | 65.6 |
| 1800 | 500 | 6 | 25 | 65.6 |
| 1800 | 1000 | 6 | 45 | 65.6 |
| 1800 | 1500 | 6 | 66 | 65.6 |
| 1800 | 2000 | 6 | 86 | 65.6 |
| 1800 | 2500 | 6 | 106 | 65.6 |
| 1800 | 2500 | 6 | 106 | 73.9 |

Each of the six rings of the vane pumps of Examples 1A-1D and Comparative Examples 1E-1F is then visually evaluated for gouging, e.g., ring burn. The results of the visual inspection are summarized below in Table 3.

TABLE 3

Vane Pump Ring Burn Evaluation

| Vane Pump | Coating Summary | Observable Ring Burn? | Coating Degradation? |
|---|---|---|---|
| Ex. 1A | AlMgB$_{14}$ + C (sputter) | No | No |
| Ex. 1B | AlMgB$_{14}$ + C (gas) | No | No |
| Ex. 1C | AlMgB$_{14}$—TiB$_2$ + C (sputter) | No | No |
| Ex. 1D | AlMgB$_{14}$—TiB$_2$ + C (gas) | No | No |
| Comp. Ex. 1E | AlMgB$_{14}$ | Yes | Yes |
| Comp. Ex. 1F | AlMgB$_{14}$—TiB$_2$ | Yes | Yes |

Each of the four vane pumps of Examples 1A-1D including vanes coated with the coatings of Reference Examples A-D is operated at a speed of 1,800 rpm and temperature of 65.6° C. over pressures of from minimal to 2,500 psi. For comparison, a vane pump of Comparative Example 1G, including vanes that are substantially free from the coatings of Reference Examples A-D, is also operated under the same conditions. A mechanical efficiency is calculated for each of the five vane pumps by comparing a pump input to a pump output. The results are summarized below in Table 4.

The vane pumps of Examples 1A-1D exhibit reduced friction between surfaces and reduced wear during operation as compared to the vane pumps of Comparative Examples 1E-1F due to the coating of Reference Examples A-D. Therefore, as compared to the vane pumps of Comparative Examples 1E-1F, the vane pumps of Examples 1A-1D require less torque at start-up and have excellent start-up mechanical efficiency. The vane pumps of Examples 1A-1D operate over a larger range of pressure, i.e., up to 3,000 psi, and therefore have excellent power density as compared to the vane pumps of Comparative Examples 1E-1F. Additionally, the vane pumps of Examples 1A-1D operate over a larger range of speed and pressure without failure and/or degradation as compared to the vane pumps of Comparative Examples 1E-1F. Finally, the vane pumps of Examples 1A-1D minimize component degradation, such as ring burn.

Further, the vane pumps of Examples 1A-1D also exhibit reduced friction between surfaces and increased mechanical efficiency during operation as compared to the vane pump of Comparative Example 1G. Therefore, since the vane pumps of Examples 1A-1D are more efficient than the vane pump of Comparative Example 1G, the vane pumps of Examples 1A-1D may be smaller and consume less energy for a given torque output.

Example 2

Valve-In-Star Motor—Single Coated Surface

Two valve-in-star motors, each including a star valve, are provided for evaluation. The star valve of one valve-in-star motor is coated with the coating of Reference Example C as set forth above to prepare the valve-in-star motor of Example 2C. Likewise, the star valve of a second valve-in-star motor is coated with the coating of Reference Example D as set forth above to prepare the valve-in-star motor of Example 2D. For comparison, a star valve of a valve-in-star motor of Comparative Example 2H is substantially free from the coatings of Reference Examples C and D.

A mechanical efficiency at start-up is simulated for each of the valve-in-star motors of Examples 2C and 2D and Comparative Example 2H by holding a speed of each valve-in-star motor constant at 0.1 rpm while turning each valve-in-star motor one revolution clockwise and one revolution counter clockwise. The input flow and pressure and output torque and speed are recorded to evaluate the start-up mechanical effi-

TABLE 4

Vane Pump Mechanical Efficiency

| Vane Pump | Coating Summary | Eff. at 250 psi | Eff. at 500 psi | Eff. at 1,000 psi | Eff. at 1,500 psi | Eff. at 2,000 psi | Eff. at 2,500 psi |
|---|---|---|---|---|---|---|---|
| Ex. 1A | AlMgB$_{14}$ + C (sputter) | ≥77% | ≥84% | ≥89% | ≥91% | ≥95% | ≥91% |
| Ex. 1B | AlMgB$_{14}$ + C (gas) | ≥77% | ≥84% | ≥89% | ≥91% | ≥95% | ≥91% |
| Ex. 1C | AlMgB$_{14}$—TiB$_2$ + C (sputter) | ≥77% | ≥84% | ≥89% | ≥91% | ≥95% | ≥91% |
| Ex. 1D | AlMgB$_{14}$—TiB$_2$ + C (gas) | ≥77% | ≥84% | ≥89% | ≥91% | ≥95% | ≥91% |
| Comp. Ex. 1G. | No coating | 75% | 82% | 87% | 89% | 92% | 89% | ciency for each valve-in-star motor. The mechanical efficiency at start-up is summarized below in Table 6.

TABLE 6

Valve-In-Star Motor Mechanical Efficiency at Start-Up

| Valve-In-Star Motor | Coating | Mech. Eff. at Start-Up |
|---|---|---|
| Ex. 2C | AlMgB$_{14}$—TiB$_2$ + C (sputter) | 50.4% |
| Ex. 2D | AlMgB$_{14}$—TiB$_2$ + C (gas) | 50.4% |
| Comp. Ex. 2H | None | 46% |

The valve-in-star motors of Examples 2C and 2D exhibit reduced friction between surfaces and reduced wear during operation as compared to the valve-in-star motors of Comparative Example 2H due to the coatings of Reference Examples C and D. Therefore, as compared to the valve-in-star motor of Comparative Example 2H, the valve-in-star motors of Examples 2C and 2D require less torque at start-up and have excellent start-up mechanical efficiency. In particular, the mechanical efficiency at start-up of the valve-in-star motors of Examples 2C and 2D is increased by at least 4% as compared to the valve-in-star motor of Comparative Example 2H. Further, since the valve-in-star motors of Examples 2C and 2D are more efficient than the valve-in-star motor of Comparative Example 2H, the valve-in-star motors of Examples 2C and 2D may be smaller and consume less energy for a given torque output.

Example 3

Valve-In-Star Motor—Multiple Coated Surfaces

Three valve-in-star motors, each including a star valve, a plurality of rollers, and a ring, are provided for evaluation. The star valve of one valve-in-star motor is coated with the coating of Reference Example C as set forth above to prepare the valve-in-star motor of Example 3C1. The plurality of rollers and the ring of a second valve-in-star motor are coated with the coating of Reference Example C as set forth above to prepare the valve-in-star motor of Example 3C2. The plurality of rollers, the ring, and the star valve of a third valve-in-star motor are coated with the coating of Reference Example C as set forth above to prepare the valve-in-star motor of Example 3C3. For comparison, a star valve, a plurality of rollers, and a ring of a valve-in-star motor of Comparative Example 3J is each substantially free from the coatings of Reference Examples A-D.

A mechanical efficiency at start-up is simulated for each of the valve-in-star motors of Examples 3C1-3C3 and Comparative Example 3J by holding a speed of each valve-in-star motor constant at 0.1 rpm while turning each valve-in-star motor one revolution clockwise and one revolution counter clockwise. The input flow and pressure and output torque and speed are recorded to evaluate the start-up mechanical efficiency for each valve-in-star motor. The mechanical efficiency at start-up for each valve-in-star motor is summarized below in Table 7.

TABLE 7

Valve-In-Star Motor Mechanical Efficiency at Start-Up

| Valve-In-Star Motor | Coating | Coated Surface | Eff. at Start-Up |
|---|---|---|---|
| Ex. 3C1 | AlMgB$_{14}$—TiB$_2$ + C (sputter) | Star Valve | 50.4% |
| Ex. 3C2 | AlMgB$_{14}$—TiB$_2$ + C (sputter) | Rollers, Ring | 51.7% |
| Ex. 3C3 | AlMgB$_{14}$—TiB$_2$ + C (sputter) | Rollers, Ring, Star Valve | 54.4% |
| Comp. Ex. 3J | None | None | 46% |

The valve-in-star motors of Examples 3C1-3C3 exhibit reduced friction between surfaces and reduced wear during operation as compared to the valve-in-star motors of Comparative Example 3J due to the coating of Reference Example C. Therefore, as compared to the valve-in-star motor of Comparative Example 3J, the valve-in-star motors of Examples 3C1-3C3 require less torque at start-up and have excellent start-up mechanical efficiency. In particular, the mechanical efficiency at start-up of the valve-in-star motors of Examples 3C1-3C3 is increased by at least 4% as compared to the valve-in-star motor of Comparative Example 3J. Moreover, the mechanical efficiency at start-up of the valve-in-star motors including at least a first coated surface and a second coated surface, i.e., Examples 3C2 and 3C3, is increased by at least 5% and 8%, respectively, as compared to the valve-in-star motor of Comparative Example 3J. Further, since the valve-in-star motors of Examples 3C1-3C3 are more efficient than the valve-in-star motor of Comparative Example 3J, the valve-in-star motors of Examples 3C1-3C3 may be smaller and consume less energy for a given torque output.

While the best modes for carrying out the invention have been described in detail, those familiar with the art to which this invention relates will recognize various alternative designs and embodiments for practicing the invention within the scope of the appended claims.

The invention claimed is:

1. A device configured for converting energy, the device comprising:
    a first surface;
    a second surface configured for moving with respect to said first surface during operation of the device; and
    a coating disposed on at least one of said first surface and said second surface, said coating including;
        a first layer of a ceramic alloy represented by the general formula AlMgB$_{14}$—X;
    wherein X is present in an amount of from 0 to 70 parts by weight based on 100 parts by weight of said ceramic alloy and is a doping agent selected from the Group IV elements and borides and nitrides thereof; and
        a second layer disposed on said first layer and including:
            said ceramic alloy; and
            carbon present in an amount of from about 1 part by weight to 90 parts by weight based on 100 parts by weight of said second layer, and in a gradient concentration that increases with a distance from said first layer; and
    wherein said coating has a hardness of from 10 to 20 GPa;
    wherein said coating has a coefficient of friction of less than or equal to 0.12.

2. The device of claim 1, wherein said device is a vane pump including a vane disposed within a ring.

3. The device of claim 2, wherein at least one of said first surface and said second surface is an edge of said vane.

4. The device of claim 2, wherein at least one of said first surface and said second surface is a surface of said ring.

5. The device of claim 2, wherein a mechanical efficiency of said vane pump is increased by at least 2% when operated at a pressure of from 250 to 2,500 psi as compared to a vane pump that is substantially free from said coating.

6. The device of claim 2, wherein said vane pump is substantially free from gouging after operating at a speed of about 1,800 rpm at a pressure of from 250 to 3,000 psi and a temperature of from 150 to 165° F. for approximately 240 minutes.

7. The device of claim 1, wherein said device is an axial piston pump including a plate and a piston that is disposed within a cylinder barrel and adjacent a piston shoe.

8. The device of claim 7, wherein at least one of said first surface and said second surface is a surface of said piston.

9. The device of claim 7, wherein at least one of said first surface and said second surface is a surface of said cylinder barrel.

10. The device of claim 7, wherein at least one of said first surface and said second surface is a surface of said plate.

11. The device of claim 7, wherein at least one of said first surface and said second surface is a surface of said piston shoe.

12. The device of claim 1, wherein said device is an orbital motor that is configured to be driven by a drive.

13. The device of claim 12, wherein at least one of said first surface and said second surface is a surface of a roller of said orbital motor.

14. The device of claim 12, wherein at least one of said first surface and said second surface is a surface of a ring of said orbital motor.

15. The device of claim 12, wherein at least one of said first surface and said second surface is a surface of a plate of said orbital motor.

16. The device of claim 12, wherein at least one of said first surface and said second surface is a surface of a valve of said orbital motor.

17. The device of claim 12, wherein a mechanical efficiency at start-up of said orbital motor is increased by at least 4% as compared to an orbital motor that is substantially free from said coating including X present in an amount of from 0 to 70 parts by weight based on 100 parts of said ceramic alloy.

18. A method of reducing friction between a first surface and a second surface configured for moving with respect to the first surface, the method comprising the steps of:
forming a first layer of a ceramic alloy represented by the general formula $AlMgB_{14}$—X on at least one of the first surface and the second surface;
wherein X is present in an amount of from 0 to 70 parts by weight based on 100 parts by weight of the ceramic alloy and is a doping agent selected from the Group IV elements and borides and nitrides thereof; and
depositing a second layer onto the first layer to thereby form a coating on at least one of the first surface and the second surface that reduces friction between the first surface and the second surface, wherein the second layer includes:
the ceramic alloy; and
carbon present in an amount of from about 1 part by weight to 90 parts by weight based on 100 parts by weight of the second layer, and in a gradient concentration that increases with a distance from the first layer;
wherein the coating has a hardness of from 10 to 20 GPa;
wherein the coating has a coefficient of friction of less than or equal to 0.12.

19. The method of claim 18, wherein said depositing is further defined as sputtering the first layer with a target material including carbon.

20. The method of claim 18, wherein said depositing is further defined as decomposing a carbon-based gas in the presence of the first layer.

\* \* \* \* \*